SEMICONDUCTOR DEVICE

Filed May 27, 1966

INVENTORS
ELSE KOOI
AANT B. D. VAN DER MEER
BY
Frank R. Jifano
AGENT

United States Patent Office 3,580,745

Patented May 25, 1971

3,580,745

SEMICONDUCTOR DEVICE

Else Kooi and Aant Bouwe Daniel van der Meer, Emmasingel Eindhoven, Netherlands, assignor to U.S. Philips Corporation, New York, N.Y.

Filed May 27, 1966, Ser. No. 553,409
Claims priority, application Netherlands, June 5, 1965, 6507231
Int. Cl. H01l 7/34, 7/54
U.S. Cl. 148—1.5 5 Claims

ABSTRACT OF THE DISCLOSURE

A method of making different circuit elements integrated in a common semiconductive wafer by modifying the properties and composition of the oxide portions which cover the surface of the wafer over the elements. Various methods are described for obtaining different oxide properties, for example, providing a layer of silicon monoxide over the usual silicon dioxide, or subjecting selected oxide coating portions to X-radiation or ultraviolet radiation.

This invention relates to semiconductor devices having a plurality of circuit elements built up on the same semiconductor body, in which a part appearing at the surface of one circuit element has a material construction of similar type as that of a part appearing at the surface, of another circuit element, said part having relatively differing electrical properties and being covered by oxide coatings. It also relates to methods of manufacturing such semiconductor devices.

Such devices are generally built up and the various circuit elements coupled in a way such that the assembly constitutes a circuit unit, more commonly named an integrated circuit. Whenever reference is made to material construction of similar type, it should be understood herein to mean that the parts, if consisting of material of one conductivity type, are of the same conductivity type or, if consisting of one or more regions of different conductivity types, that comparable regions of the two parts have the same conductivity type and correspond in their location with respect to the other regions; for example each part may have a region of n-type material obtained by local diffusion of a donor into a substrate of p-type material or a region of p-type material obtained by local diffusion of an acceptor into a substrate of n-type material.

Such a circuit unit must usually have different kinds of circuit elements. In manufacturing such a circuit unit use is generally made of diffusion processes and suitable masks in order to obtain locally regions of a given conductivity type at the surface of the semiconductor body in a substrate of opposite conductivity type.

By means of photographic processes masking patterns are generally obtained consisting of an oxide, for example silicon oxide, so that, after diffusion of a suitable impurity, various regions of desired shapes and dimensions of a conductivity type opposite to the material of the substrate are obtained. It would be desirable, on the one hand, to obtain regions of a given conductivity type for various circuit elements as far as possible by means of one diffusion process and, on the other hand, to match the diffusion process for obtaining a region intended for a given circuit element as far as possible to the desired properties of the relevant circuit element. However, for different kinds of circuit elements or for the same kind circuit elements having relatively differing desired characteristics, the requirements for the composition of the material of the substrate and for the junction between such a region and the material of the substrate are not the same for optimum characteristics of each circuit element.

To this end, a plurality of diffusion processes with impurities of the same type might be carried out, if possible, a separate mask having to be used for each diffusion process.

Such a procedure is laborious and renders the circuit unit expensive. One may be satisfied with circuit elements not all of which have an optimum performance, in order that the number of diffusion processes may be limited, but this involves a risk that the complete circuit unit does not satisfy the requirements imposed. It may also be endeavoured, if possible, to modify the circuit unit by adding further circuit elements in order to improve the circuit unit and thus find compensation for circuit elements having less favourable characteristics, but such steps render the circuit unit more complicated.

An object of the present invention is inter alia to achieve in a comparatively simple manner that, in a semiconductor device of the kind mentioned in the preamble, the electrical properties of the circuit elements are matched better to the requirements imposed.

It is based upon the recognition that it is possible to utilize the known influence of the oxide coating on the properties of a part of a circuit element covered with such an oxide coating.

According to a first aspect of the invention, a semiconductor device having a plurality of circuit elements built up on the same semiconductor body, in which a part appearing at the surface of one circuit element has a composition of material similar to that of a part appearing at the surface of another circuit element and in which these parts have relatively differing electrical properties and are covered by oxide coatings, is characterized in that the two parts have an identical material construction as to the doping of the semiconductor material, but have acquired relatively different electrical properties by means of different properties of their oxide coatings. The two parts may wholly consist of material of one given conductivity type or each may have one or more p-n junctions. Whenever reference is made to identical material construction, this is intended to mean that similar regions of the said parts have the same concentration or concentrations of the same impurity or impurities. Whenever reference is made the properties of the oxide coating, this is to be understood to include the properties of the junction between the oxide of the coating and the underlying semiconductor material. It is to be noted that it is known per se that the electrical properties of a semiconductor device may be influenced by the properties of an oxide coating used therefor. However, it has never been suggested to give different properties to parts of various circuit elements built up on the same semiconductor body and having identical material construction by means of their oxide coatings.

The term "circuit elements" is to be understood herein to mean not only those elements which fulfil a direct circuit function in a circuit unit, such as transistors, diodes, capacitors and resistors, hereinafter referred to as functional circuit elements, but also parts of the semiconductor body which fulfil an indirect function in a circuit unit, such as conducing connections or parts serving for insulation between two functional circuit elements, hereinafter referred to as "additional circuit elements." In fact, while in a circuit designed in the usual manner having separate, relatively insulated circuit elements connected in the desired pattern by means of metal wires surrounded by insulating material it is generally not necessary to take particular steps for insulation, with circuit units built up on one semiconductor body it is necessary, because of the semiconductive character of the material of the substrate, to take particular steps for relatively insulating the various circuit elements, for example by providing one or more p-n junctions between the said elements which in normal operations are, for example, biased in the reversed direction or in which for other reasons only a small leakage current may pass via the p-n junction.

The present invention even permits of giving different properties to two circuit elements which are identical not only with respect to their material construction but also in size and dimensions.

According to a second aspect of the invention a method of manufacturing a semiconductor device according to the first aspect of the invention in which a plurality of semiconductor circuit elements is manufactured at one side of a semiconductor body and is covered, at least in part, with oxide coatings, is characterized in that a difference in properties of oxide coatings on parts of different circuit elements, which parts are given an identical material construction as to the doping of the semiconductor material, is made by applying oxide coatings of substantially different composition on said parts and/or by means of difference in formation and/or treatment of the oxide coatings on said parts.

The oxide coatings on two corresponding parts of two different circuit elements on the body may have substantially different compositions of the oxide. However, a difference in properties may also occur with substantially similar positions of the oxide coatings, for example by carrying out different after-treatments, as will be described in detail hereinafter. The oxide on such a part may be formed before or during the diffusion treatments used. Alternatively, it may be applied afterwards. The oxide coating need not always be homogeneous and may comprise two or more layers of different compositions. Such a coating comprising more than one layer is obtained, for example, if an oxide coating previously existed on one part and thereafter a diffusion treatment is carried out during which the oxide layer serves as a mask. During this treatment an outer layer may be formed composed of the initial oxide material and the oxide of the impurity locally diffused into the semiconductor material.

The influence of the oxide coatings is possibly attributable to the formation of divisions of charge, for example of an electrical double layer, in the region of the junction between the semiconductor material and the oxide coating. Due to said double layer it is possible that an inversion layer is formed in the semiconductor material adjacent to the coating, that is to say a layer which acts as a layer of a type opposite to that of the underlying material, so that at the surface sort of a conductive region of opposite type to that of the substrate is formed.

The difference in properties of the oxide coatings may be obtained in different ways. Oxide coatings which may be present on the surface after the formation of the two parts of identical material construction, which coatings generally have the same composition, may be removed from the two parts and replaced by oxide coatings of different compositions. It is also possible to remove the oxide from one part and not from the other part, whereafter an oxide coating of differing composition is applied to the first-mentioned part. Once the two different oxide coatings are applied, preferably a suitable after-treatment is carried out, for example a post-heating process, preferably at a temperature at which the donors and acceptors cannot substantially diffuse in the semiconductor material.

If an oxide coating comprising two or more layers of different compositions is formed on the two parts, it is possible to remove one or more of said layers but not all of them, from one part and not from the other part, followed by a suitable after-treatment, for example a thermal treatment at a temperature at which the donors and acceptors cannot substantially diffuse in the underlying semiconductor material. As an alternative, preferably if equal oxide coatings are present on the two parts, it is possible to apply an additional layer to the available oxide coating on one part and not on the other part, for example either an oxide layer of a different composition or a layer of a different material, for example metal. In this case also an after-treatment should follow or similar steps should be carried out during the formation, for example a thermal treatment such as described hereinbefore, to obtain a difference in properties of the oxide coatings. When using an additional layer of conductive material, for example metal, the additional layer during the thermal treatment is preferably electrically shortcircuited with the material of the substrate. It is also possible, if desired, to remove the additional layer at a low temperature, for example room temperature, subsequent to the after-treatment, by means of an etchant or a solvent, while retaining the difference in properties of the oxide coatings on the two parts. In fact, in certain cases such a conductive layer, for example a metal layer, may give rise to unwanted capacitive couplings. It is to be noted that especially in circuits units comprising more than one circuit element built up on one semiconductor body, the surface of which is covered, at least in part, with an oxide coating, thin metal layers may be applied to said oxide coating for interconnecting circuit elements, for contacting or serving as parts of circuit elements, for example for capacitive coupling with the substrate. Said thin layers in themselves do not cause any modification in the properties of the oxide coating. This may arise only with a suitable additional treatment before or during the formation, such as a suitable thermal treatment.

According to another aspect of the invention, a semiconductor device comprising a semiconductor body, the surface of which being at one side at least partly covered with an oxide coating consisting of silica or a silica containing oxide, at least part of said coating is covered with a silicon monoxide layer. It was found that such a silicon monoxide layer on top of said silica coating or silica containing oxide coating may lead to stable devices. In particular the said additional layer may be used in metal-oxide semiconductor (MOS) transistors on top of the oxide coating between source and drain regions. When the semiconductor body consists of silicon and the MOS transistor is of the npn-type, said MOS transistor may show no n-type channel or at most an n-type channel of very low conductivity at zero-gate bias, such that the MOS transistor has enhancement-mode characteristics, specially when applying a fresh silicon dioxide coating after the diffusion treatment for forming the source and drain regions and removal of the oxide masking layer used in said diffusion treatment, the silicon monoxide layer being applied to said fresh silicon dioxide coating.

The device according to the latter aspect of the invention is not limited to devices according to the first aspect of the invention, but may be a single circuit element or may comprise more circuit elements in which each comprises a silicon monoxide layer on top of a silica coating or a silica containing oxide coating on parts of similar material construction.

In manufacturing a device according to the latter aspect of the invention, preferably a suitable after treatment is used after the application of said silicon monoxide layer for stabilisation of the device, said after treatment preferably being carried out at a temperature and during a time such that no substantial diffusion of acceptors or donors in the semiconductor material may occur. The after-treatment may consist of a heat-treatment, preferably in an oxygen-containing atmosphere, f.i. in dry oxygen.

While with the use of a given oxide coating a change in the properties thereof may be obtained by a thermal treatment for a certain period of time at a given temperature, it has furthermore been found that the use of a temperature gradient in many cases may cause another variation which permits a given difference in properties to be obtained, for example, if the oxide coatings have different compositions. It is for instance possible to give the substrate a temperature higher than that of the upper side of the oxide coating, whereas the reverse process may in principle likewise cause a difference in properties of the oxide coatings if their compositions are different.

Another method of after-treatment consists in the action of vapour or gas of a given composition. Thus, in certain cases, it has been found that steam on a heated oxide coating may cause a certain variation in the properties of the oxide coating. If the oxide coatings on two parts have different compositions a desired difference in properties may also be obtained in this way.

According to a further feature of the invention, the properties of an oxide coating on a semiconductor body may be influenced by radiation treatments to a semiconductor body with its final structure of differently doped regions and at least locally covered with a final oxide coating, said oxide layer being at least in part subjected to an irradiation treatment.

The radiation treatment may be a heat-radiation treatment at the side of the oxide coating, in which preferably the body is cooled at the side opposite to the irradiated side.

The radiation treatment may also be carried out with X-rays, the change in properties of the oxide coating depending on the amount of X-rays impinging on the oxide coating. In this manner semi-conductor devices, f.i. of the MOS-type, may be used as röntgendosimeters, by means of the change in characteristics of the device after exposure to X-rays. Regeneration to the original characteristics may be carried out by other means, f.i. by heat-treatment or a treatment with rays of other wavelength which affect the properties of the oxide coating in a reversed sense.

Further a radiation treatment with ultraviolet rays may be used.

The use of irradiation treatments according to the invention is not limited to semiconductor devices comprising several circuit elements in one body but may be used also in the case of semiconductor devices comprising a single ciricuit element in one semiconductor body. Further said irradiation treatments are not limited to giving different properties to oxide coatings onto parts of identical material construction, although irradiation treatments are specially suitable for the latter case.

It should be kept in mind that with the present radiation treatments normal ultraviolet irradiation in the application of photoresist methods in the manufacture of semiconductor devices is not included in the irradiation treatment according to the present invention.

In particular the use of irradiation for acting on the properties of the oxide coating makes it possible, by using a suitable mask, to expose one part to radiation and the other part not. Such irradiation with the use of a local mask may be used for oxide coatings of different compositions as well as those of similar composition. When using oxide coatings of different compositions on the two parts it is also possible to expose both parts to the same irradiation treatment for obtained a difference in properties of their oxide coatings.

It has been found that the choice of the wavelength range of the radiation used may be important. The optimum wavelength range for obtaining a given variation in properties of the oxide coatings may be chosen by experiments.

It has even been found that, with the choice of a different wavelength range, a different effect on the properties of the same oxide coating is obtainable. Different irradiations may even have relatively opposite effects. This makes it possible inter alia first to expose both parts covered with oxide coatings to radiation to the same wavelength range and then to use irradiation of opposite effect while masking one part.

The aforementioned after-treatments may furthermore be combined in a suitable manner to obtain certain desired effects. In this case also it is possible, for example, to use relatively opposite effects, for example, first one or more after-treatments without using radiation and then an irradiation treatment with opposite effect during which one part is masked and the other not.

Instead of two parts of identical material construction, it is of course also possible for more parts of identical material construction belonging to different circuit elements to be given a difference in properties by using oxide coatings of different properties.

In order that the invention may be readily carried into effect, it will now be described in detail, by way of example, with reference to the accompanying diagrammatic drawing, in which.

Figure 1:
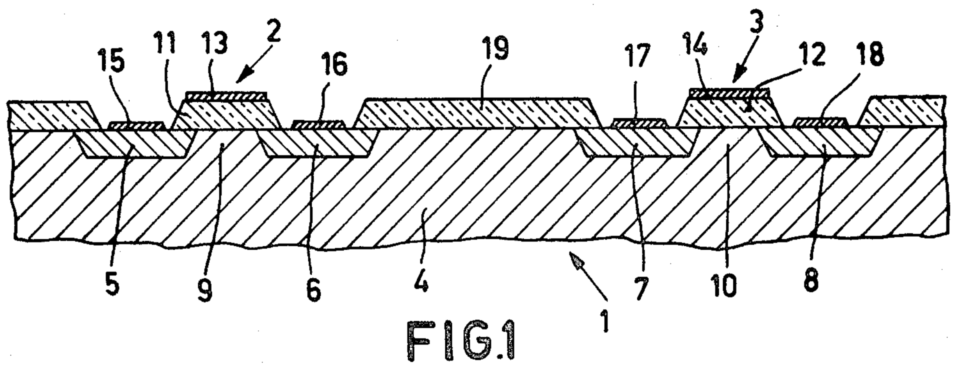
FIG. 1 shows, in vertical cross-section, part of a semiconductor device having two field-effect transistors.

FIG. 1 shows part of a semiconductor body 1 having a plurality of circuit elements emerging at one surface, in this example two field-effect transistors 2 and 3. The body consists of, for example, homogenously doped p-type semiconductor material 4 of comparatively low resistivity in which four n-type regions 5, 6, 7 and 8 have been formed by diffusion of a donor with the use of a masking oxide layer.

The n-type regions formed have an identical material construction. A p-type region 9 between the regions 5 and 6 and a p-type region 10 between the regions 7 and 8 are covered with oxide coatings 11 and 12, respectively, which preferably also covers the junctions with the adjacent n-type regions. The n-type regions 5, 6, 7 and 8 may be of identical shape and size, while the spacing between the regions 5 and 6 may also be equal to that between the regions 7 and 8. Electrodes 13 and 14 in the form of thin metal layers are applied to the oxide coatings 11 and 12, respectively, and ohmic contacts in the form of thin metal layers 15, 16, 17 and 18 are formed on the n-type regions 5, 6, 7 and 8, respectively. Two field-effect (MOS) transistors 2 and 3 have thus been formed which are identical in their material construction. The two oxide coatings 11 and 12 differ in properties, however, so that a thin substantially electron-conductive zone is formed at the junction between the oxide coating 12 and the underlying p-type material 10, whereas such a zone is not formed or is formed with a much poorer construction at the junction between the oxide coating 11 and the underlying p-type material 9. The said thin zone is sometimes referred to as inversion layer since this zone as it were exhibits a conductivity type opposite that of the underlying semiconductor material.

In the case under consideration a positive charge is possibly built up at the junction between the oxide coating 12 and the underlying semiconductor material on the side of the oxide and a negative charge on the side of the semiconductor material, the density of the charges being such that in a thin zone adjacent the junction with the oxide, the concentration of the original majority charge carriers (holes) has greatly decreased and the concentration of the original minority charge carriers (electrons) has greatly increased to such an extent that said thin zone has become substantially n-conducting. Due to the comparatively high concentration of electrons in this thin zone an n-conductive channel is formed between the two n-type regions 7 and 8. If a contact 18, the drain contact of the field-effect transistor 3 is biased positively with respect to the contact 17, the source contact, while the electrode 14, the gate, is shortcircuited with the source, an electric current will pass between source and drain via the said n-conductive channel. In the field effect transistor 2, which does not have such a conductive channel, for a corresponding potential between its drain contact 16 and its source contact 15 with the gate electrode 13 shortcircuited with the source contact 15, at most a very small leakage current will flow between source and drain since the junction between the n-type region 6 and the p-type region 9 is blocked also at the surface of the semiconductor body.

Figure 2:
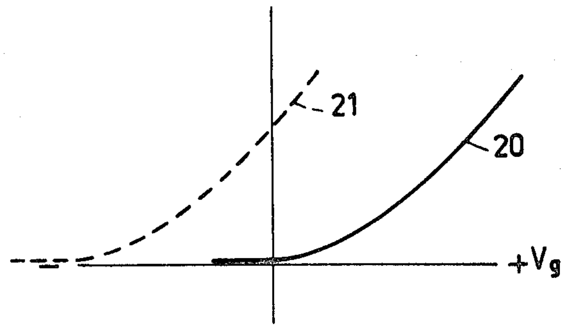
FIG. 2 is a graph showing the characteristics of the two field-effect transistors of FIG. 1.

FIG. 2 shows a graph, in which for the field-effect transistors 2 and 3, at a constant voltage between source and drain, the current strength between the source and drain, $i_{ds}$, is plotted against the voltage, $V_g$, hereinafter referred to as the gate voltage, applied between gate and source. The curve 20 drawn in full line relates to the field-effect transistor 2 and the curve drawn in broken line relates to the field effect transistor 3. From the full line curve 20 it may be seen that, if the gate voltage increases from 0 to positive values, the current strength $i_{ds}$ also increases from subtantially 0.

The influence of the gate voltage on the current strength $i_{ds}$ may be explained as follows. As a result of the positive gate voltage the holes adjacent the junction between the oxide layer 11 and the underlying p-type region 9 are repelled away from the surface, the concentration of electrons thus increasing in a thin zone along the said surface and forming a conductive channel between the n-type regions 5 and 6. The more positive the gate voltage is, the broader becomes the said n-conductive zone and the lower is the resistance for the electron current from source to drain. However, the field-effect transistor 3 already has a conductive channel for electrons from the source region 7 to the drain region 8.

However, by applying a negative voltage to the gate electrode 14, the concentration of electrons in the thin inversion layer becomes lower due to attraction of holes from the p-type material of region 10 located beneath said inversion layer, while the width of the n-conductive channel also decreases until the current path between source and drain regions is substantially cut-off when applying a sufficient high negative gate voltage. So in the field-effect transistor 3, due to increase in the bias, in this case negative, of the gate the current strength between source and drain is decreased whereas in the field-effect transistor 2, upon increase in the bias, in this case positive, of the gate the current strength between source and drain is increased. Two field-effect transistors are thus present in the same semiconductor body, which, although being substantially identical with respect to their semiconductor material construction, yet have different electrical properties due to difference in properties of their oxide coatings. For obtaining such difference in properties it is not necessary to use separate diffusion processes for obtaining the required doping of each field-effect transistor.

It will be evident, that, although npn-type field effect transistors have been described above, such differences in properties may fundamentally also be obtained in case of two pnp-type field-effect transistors by difference in properties of their oxide coatings.

To prevent the two field-effect transistors 2 and 3 from interfering with one another in their performance it must be avoided that a conductive connection at the semiconductor surface exists between the source or drain of one field-effect transistor and the source or drain of the other field-effect transistor, for example between the source region 7 of field-effect transistor 3 and the drain region 6 of field-effect transistor 2. An oxide coating 19 is chosen to have properties such that no electron-conductive channel is formed adjacent the junction with the underlying p-conductive material.

Consequently the oxide coating 19 must be given a difference in properties relative to the oxide coating 11 which otherwise covers the same p-type material of the body 1.

Figure 3:
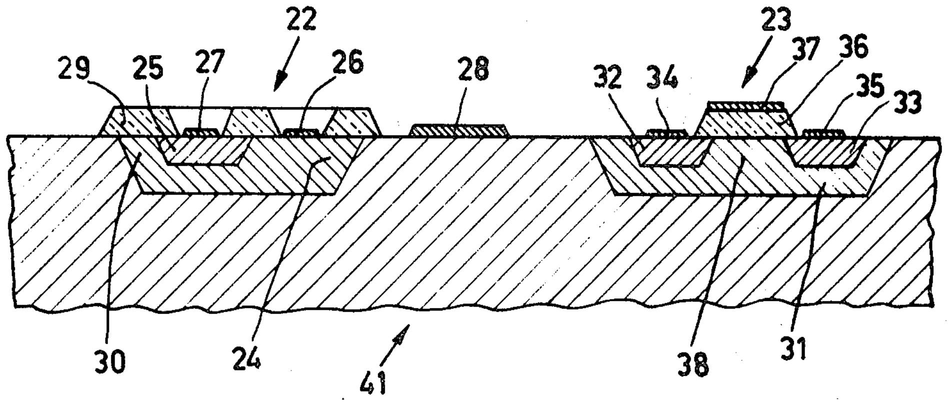
FIG. 3 shows, in vertical cross-section, part of a semiconductor device having a transistor and a field-effect transistor.

FIG. 3 shows part of a semiconductor body 41 of homogeneously doped n-type material in which more than one circuit element is formed at one side. In the illustrated part of the body an ordinary npn-type transistor 22 and an npn-type field-effect (MOS) transistor 23 have been formed, for example by diffusion processes using suitable masking, during which first two p-type regions 24 and 31 have been formed simultaneously by diffusion of an acceptor and then three n-type regions 25, 32 and 33 have been formed simultaneously by diffusion of a donor.

The transistor 22 is constituted by the n-type region 25 as the emitter, provided with an ohmic emitter contact 27 in the form of a metal layer, the p-type region 24 as the base, provided with an ohmic base contact 26 in the form of a metal layer, and the original n-type material as the collector provided with a collector contact 28 in the form of a metal layer.

An oxide layer 29 covers, except a window for the base contact 26, the surface of the base region between the emitter and the collector.

The field-effect transistor 23 comprises the p-type substrate 31 on which no contact is provided, the n-type source region 32 provided with an ohmic contact 34, and the n-type drain region 33 provided with an ohmic contact 35. A p-type region 38 between the n-type regions 32 and 33 is covered with an oxide coating 36 on which a gate electrode 37 is formed. The oxide coating is such that, without biasing the gate electrode 37, an n-conductive channel is formed between the regions 32 and 33. This npn-type field-effect transistor thus has a characteristic of the type corresponding to the broken line curve 21 of FIG. 2.

The oxide coating 29 of transistor 22 differs in properties from the oxide coating 36 to such an extent that no n-conductive channel is formed at the surface of the base region 30. Such a conductive channel would result in a leakage path between the emitter and the collector which is undesirable for the performance of the transistor.

It will be evident that the described examples of combinations of circuit elements having parts of identical material construction, but having oxide coatings which relatively differ in properties, is not limitative for the invention and that a great many other combinations of such circuit elements comprising parts with identical material construction may be given improved electrical properties by different properties of their oxide coatings. Thus it is possible, for example, to manufacture simultaneously an npn-type transistor and an npnp-type thyristor in the same semiconductor body by suitable diffusion processes and to obtain an optimum current gain characteristic for the transistor and desired switching properties for the thyristor by means of different properties of the oxide coatings for example on the n-p junctions of identical material construction, between the emitter and the base of the transistor, on the one hand, and between the emitter and the control electrode region of the thyristor on the other.

It is to be noted that it is known as such to form a capacitively controlling electrode on an oxide coating on an n-p or p-n junction between the emitter and the base of a transistor or on an oxide coating on an n-p or p-n junction between the emitter and the control electrode region of a thyristor, the potential applied to said capacitively controlling electrode being capable of influencing the electrical properties of such a circuit element. However, this requires the use of an additional electrode and a connection to said electrode.

Several examples now follow of methods for obtaining oxide coatings of different properties on parts of a semiconductor body having an identical material construction as to their dopings.

(I) Use is made of a monocrystalline wafer of silicon consisting of indium-activated p-type silicon having a resistivity of 5 ohm-cm. and surfaces at right angles to the 111-axis. The surface is polished on one side in known manner using fine powdered aluminum oxide and then etched with a mixture of concentrated nitric acid and concentrated hydrofluoric acid. A silicon-oxide coating is applied to said surface by thermal oxidation at 1200° C. in moist oxygen obtained by passing pure oxygen through water at 30° C.

Windows are formed in the oxide coating in known manner by means of a photo-etching process, whereafter phosphorus is locally diffused using the masking action of the silicon-oxide coating.

To this end, the silicon slice is first heated at 920° C. for 30 minutes in a flow of nitrogen gas to which phosphorus pentoxide had been added, originating from an amount of phosphorus pentoxide heated to 220° C., whereafter the source of prosphorus pentoxide is cooled to room temperature and the silicon slice is heated at 1150° C. for 4 hours and then cooled down slowly. Phosphorus has diffused at the windows forming n-type regions of approximately 6$\mu$ thickness.

The masking oxide coating is found to have acquired a thickness of approximately 1.2$\mu$, the oxide material containing phosphorus up to a depth of approximately 0.5$\mu$ and having approximately the composition $12SiO_2 \cdot P_2O_5$. The oxide coating may be given different properties by locally covering it with an etch-resistant lacquer, for example a photoresist, it being possible to obtain the pattern to be covered by photographic means, whereupon etching take place for so short a period that the phosphorus-containing layer is locally etched away while retaining the underlying oxide coating which contains substantially no phosphorus or only very little phosphorus, whereafter the protective lacquer layer is removed. Subsequently the silicon slice is heated at 400° C. in moist nitrogen for 1 hour. Diffusion of phosphorus into silicon is substantially impossible at this temperature. Conduction properties of n-type character can be shown adjacent the junction between the p-type silicon and the oxide coating, but the conduction is only very weak at the area where the upper phosphorus-containing layer has not been removed and it is much stronger at the area where the upper phosphoric oxide-containing layer has previously been removed by the etching treatment.

It is thus possible to provide oxide coatings of relatively differing properties on parts of different circuit elements having identical material constructions. Thus it is possible, for example, to obtain a difference in properties of the field-effect transistors described above with reference to FIG. 1, in this case having source and drain regions obtained by diffusion of phosphorus, by choosing the unetched oxide coating as the oxide coating 11 in field-effect transistor 2 and the oxide coating partly removed by etching as the oxide coating 12 in field-effect transistor 3, the oxide coating 19 preferably consisting of the unetched oxide coating.

In this case the $I_{sd}-V_g$ characteristic of the field-effect transistor 2 is approximately of the kind corresponding to curve 20 of FIG. 2 where $I_{ds}$ is very small at $V_g=0$.

The corresponding characteristic of the field-effect transistor 3 is of the kind shown by curve 21 in FIG. 2.

In the semiconductor device of FIG. 3 the unetched oxide coating may be used as the oxide coating 29 of transistor 22 and the oxide coating which has been removed in part by etching may be used as the oxide coating 36 of field-effect transistor 23.

It is to be noted that the etching treatment in itself is not sufficient for obtaining the difference in properties, this difference being obtained only after the thermal after-treatment. The gate electrodes 13 and 14 are in this case formed only after this thermal treatment.

(II) In a p-type silicon slice having a resistivity of 5 ohm-cm., n-type regions are formed on one side by diffusion of phosphorus in a manner as described in the previous example. The oxide coating formed on the surface is removed from the whole surface by etching with hydrofluoric acid. Subsequently a new oxide coating is formed by heating the slice at 900° C. for 10 minutes in dry oxygen of atmospheric pressure. Next silicon monoxide (SiO) is deposited by evaporation in vacuo in known manner, during which process parts of the surface are masked by a suitable mask. Then the slice is heated at 900° C. in dry oxygen for 10 minutes. At the area where silicon monoxide has been deposited on the oxide coating only low n-type conduction can be found at the junction of the p-type silicon and the oxide coating, whereas at the area where the oxide coating has been masked during the deposition of SiO, much stronger n-type conduction is obtained at the junction of the p-type silicon and the oxide coating.

In the manufacture of the semiconductor device of FGI. 1 it is possible, in forming the oxide coatings 11 and 19, to deposit SiO by evaporation while masking the oxide coating 12. In the manufacture of the semiconductor device of FIG. 3 it is possible, in forming the oxide coating 29, to deposit SiO by evaporation while masking the oxide coating 36.

(III) Phosphorus is locally diffused into a silicon slice of p-type in the manner as has been described in Example I. The oxide coating on the p-type silicon is now irradiated with X-ray radiation. The amount of radiation is $10^4$ röntgen per minute by using an X-ray tube having a tungsten anode and an anode voltage of 150 kilovolts and a period of irradiation of 30 minutes. After this irradiation comparatively strong n-type conduction is obtained at the junction of the oxide coating an the p-type silicon. Next the surface is locally irradiated with ultra-violet radiation from a mercury vapour lamp using a radiation mask. The comparatively strong conduction of the n-type has remained at the junction of the p-type silicon and the oxide coating at the area where the oxide coating has been masked against the action of the ultraviolet radiation, whereas no substantial n-type conduction is shown any more at the area where the surface has been irradiated with ultraviolet radiation.

Such a treatment may be used in the manufacture of the semiconductor devices shown in FIG. 1 and FIG. 3, in which the oxide coatings 11 and 19, and 29 respectively are exposed to ultra-violet radiation whereas the oxide coatings 12 and 36, respectively, are masked during this irradiation.

(IV) After local diffusion of donors and acceptors, the oxide coating obtained during this process may be removed and a silicon-oxide coating grown in the manner as described in Example II, but now in an atmosphere of oxygen saturated with steam. Next the surface is irradiated in part with ultraviolet radiation with the use of an optical mask. At the junction of the surface and the oxide coating, comparatively strong n-conduction exist at the area where the surface has not been irradiated, whereas such n-type conduction exists only to a very small extent or does not substantially exist at the area where the surface has been irradiated.

This method also may be used, for example, for obtaining suitable oxide coatings of different properties for the manufacture of the semiconductor devices of FIG. 1 and FIG. 3 a similar manner as described in Example III.

(V) It is also possible, after the diffusion treatment described in Example I, to use a thermal treatment between 300° C. and 800° C. in an atmosphere of hydrogen, followed by local irradiation with ultraviolet with a similar result as described in Example IV.

(VI) Another possibility of varying the properties of the oxide coatings on substrate material of identical material construction consists in evaporating metal (for example aluminium) onto the oxide coating obtained after the diffusion of phosphorus described in Example I, followed by a thermal treatment, for example at 300° C. to 700° C. for several minutes, during which process the metal layer, if desired, may be electrically connected to the underlying semiconductor material. Comparatively strong n-type conduction is thus obtained at the junction between the p-type silicon and the oxide coating. After local irradiation with ultraviolet this n-conduction has substantially disappeared at the irradiated areas. The metal may be removed from the oxide coating before the irradiation, but after the thermal treatment.

(VII) It is also possible to apply metal to part of the oxide coating and not to a corresponding other part, followed by the thermal treatment described in Example VI, possibly with short-circuiting of the metal layer with the underlying semiconductor material, whereafter the metal may be removed from the oxide coating, if desired. In this case also a difference in properties of the oxide coatings occurs. Comparatively strong n-type conduction occurs at the junction between the oxide coating and the underlying p-type material at the area where the metal was present during the thermal treatment, whereas this n-type conduction is only very weak at the surface areas not covered with metal. This action of a metal layer on the oxide coating, followed by a thermal treatment, is known per se and the effect may be dependent inter alia upon the metal chosen.

(VIII) It is possible to proceed in the manner described in Example VII, but to apply a certain potential between the metal layer and the underlying semiconductor material during the thermal treatment, the properties obtained for the oxide coating being dependent, as is well-known, upon the polarity and the magnitude of the voltage applied. When using different, relatively separate local metallic coatings it is now possible to make the properties of the oxide coatings different by applying different potentials, possibly even of different polarities, to the said coatings.

(IX) The treatment described in Example VIII may be still further by using, instead of the thermal treatment, an irradiation treatment, for example with X-ray radiation or ultraviolet radiation. In this case also local irradiation may be used.

(X) Further it is possible to cover various parts with oxide coatings of different chemical composition, thus resulting in a difference in properties of the oxide coatings. In this case a suitable after-treatment is preferably used, for example a thermal treatment or an irradiation treatment.

In addition to the oxide coatings specified in the preceding examples, it is possible locally to use, for example, known coatings consisting of silicon oxide and lead oxide or silicon oxide and aluminium oxide.

(XI) The thermal treatment suggested hereinbefore as the after-treatment may alternatively consist in applying a temperature gradient between the upper and lower sides of the slice, for example by heating the upper side, for example, with heat radiation and cooling the lower side, or conversely, during which process, as previously remarked, effects may be obtained which differ from the effects obtained by a thermal treatment as described above, without using a temperature gradient; it is even possible to bring about an effect which is opposite thereto. When using heat radiation it is possible again to obtain a local difference by local irradiation with infra-red.

The above-mentioned examples of methods for obtaining oxide coatings permit parts of circuit elements in the same semiconductor body having identical material construction to be given a difference in properties by means of oxide coatings having differing properties.

Silicon has been used as the semiconductor material in the previous examples, but the invention is not limited to this semiconductor material. Thus oxide coatings have also been applied to other semiconductor materials, for example germanium. In this case also the invention permits in a semiconductor device comprising a semiconductor body having a plurality of circuit elements, parts of different circuit elements having identical material construction to be given different properties by a difference in properties of the oxide coatings on said parts.

Whenever reference is made to a semiconductor body, this is to be understood to include also a body having semiconductor layers applied to an insulating substrate or separate semiconductor regions. In such a body also it is essential that the parts of semiconductor material intended for the various circuit elements can in general be subjected to the same thermal treatments, such as diffusion treatments, etc., while nevertheless each circuit element may be given as much as possible the properties required for each of them.

What is claimed is:

1. In a method of manufacturing a semiconductor device comprising a semiconductor body having contiguous regions of different concentrations of conductivity-modifying impurities forming an active junction extending to the surface of the body and covered with a final oxide coating-the improvement comprising subjecting at least part of said oxide coating to a radiation treatment employing X-rays or ultraviolet radiation to alter its properties.

2. A method as set forth in claim 1 wherein the radiation treatment includes subjecting the same coating portion to X-rays and then to ultraviolet radiation.

3. A method as set forth in claim 1 wherein part of the oxide coating is subjected to X-rays and another part subjected to ultraviolet radiation.

4. A method as set forth in claim 1 wherein the oxide coating is also subjected to a thermal treatment.

5. A method of manufacturing in a common body of semiconductive material a plurality of semiconductor circuit elements exhibiting different electrical characteristics as part of a circuit unit, comprising the steps of: subjecting spaced portions along a common surface of the common body of semiconductive material to the identical process to form within each portion adjacent the surface a different one of said plurality of circuit elements, said identical process including the introduction by diffusion into each surface portion of the semiconductive body the same concentration of conductivity-modifying impurities to form at least one p-n junction extending to said common surface, providing on said surface a common oxide coating having portions adjacent each circuit element and over the p-n junction therein which oxide coating affects the electrical characteristics of the underlying ciruit element, thereafter subjeting at least one but not all of said oxide coating portions to X-rays sufficient to alter its properties, with the result that the otherwise identical circuit elements exhibit different electrical characteristics, and connecting said circuit elements of different electrical characteristics in a circuit unit.

References Cited

UNITED STATES PATENTS

| | | | |
|---|---|---|---|
| 3,226,613 | 12/1965 | Haenichen | 148—33 |
| 3,336,661 | 8/1967 | Pounsky | 317—235UX |
| 3,357,902 | 12/1967 | Benjamin et al. | 317—235UX |
| 3,303,059 | 2/1967 | Kerr et al. | 317—235UX |
| 3,328,210 | 6/1967 | McCaloin et al. | 317—235UX |
| 3,333,326 | 8/1967 | Thomas et al. | 317—235UX |
| 3,334,281 | 8/1967 | Ditrick | 317—235 |
| 3,343,049 | 9/1967 | Miller et al. | 317—235UX |
| 3,345,216 | 10/1967 | Rogers | 317—235UX |
| 3,349,474 | 10/1967 | Rauscher | 317—235UX |
| 3,360,695 | 12/1967 | Lindmayer | 317—235UX |
| 3,386,016 | 5/1968 | Lindmayer | 317—235UX |
| 3,386,163 | 6/1968 | Brennemann et al. | 317—235UX |

L. DEWAYNE RUTLEDGE, Primary Examiner

R. A. LESTER, Assistant Examiner

UNITED STATES PATENT OFFICE
CERTIFICATE OF CORRECTION

Patent No. 3,580,745 Dated May 25, 1971

Inventor(s) ELSE KOOI and AANT BOUWE DANIEL VAN DER MEER

It is certified that error appears in the above-identified patent and that said Letters Patent are hereby corrected as shown below:

Column 5, line 59, "obtained" should read -- obtaining --;

line 71, "to" (second occurrence) should read -- of--.

Column 7, line 37, "sufficient" should read -- sufficiently --.

Column 9, line 50, "$I_{ds}$" should read -- $I_{sd}$ --.

Column 10, line 52, after "Fig. 3" insert -- in --.

Column 11, line 25, after "be" insert -- varied --.

Signed and sealed this 9th day of November , 1971.

(SEAL)
Attest:

EDWARD M.FLETCHER,JR.
Attesting Officer

ROBERT GOTTSCHALK
Acting Commissioner of Patents